United States Patent [19]
Weigand et al.

[11] 4,430,642
[45] Feb. 7, 1984

[54] DIGITAL-TO-ANALOG CONVERTER

[75] Inventors: Benjamin F. Weigand, Cantonsville; John W. Frech, Baltimore, both of Md.

[73] Assignee: Westinghouse Electric Corp., Pittsburgh, Pa.

[21] Appl. No.: 308,010

[22] Filed: Oct. 2, 1981

[51] Int. Cl.³ .............................................. H03K 13/02
[52] U.S. Cl. .............................................. 340/347 DA
[58] Field of Search ............... 340/347 DA, 347 AD, 340/347 M

[56] References Cited
U.S. PATENT DOCUMENTS

| | | | |
|---|---|---|---|
| 3,317,905 | 5/1967 | Hunt | 340/347 DA |
| 3,582,939 | 6/1971 | Campbell | 340/347 DA |
| 3,588,882 | 6/1971 | Propster | 340/347 DA |
| 4,016,555 | 4/1977 | Tyrrel | 340/347 DA |

*Primary Examiner*—C. D. Miller
*Attorney, Agent, or Firm*—H. W. Patterson

[57] ABSTRACT

Apparatus for decreasing effect of transition of more significant bits in D/A converter reference of A/D converter. A pair of D/A converters are connected in tandem to eliminate transition of more significant bits of half scale. Also, three D/A converters are connected in parallel with each being offset from one another so that the effect of bit transition is minimized and occurs at different steps in analog output.

3 Claims, 7 Drawing Figures

DIGITAL-TO-ANALOG CONVERTER

GOVERNMENT CONTRACT

The invention herein was made in the course of or under a contract or subcontract thereunder with the Department of the Air Force bearing Contract No. F19628-70-C-0218.

BACKGROUND OF THE INVENTION

1. Field of the Invention:

The present invention relates to digital-to-analog D/A converters; and more particularly, to D/A conversion apparatus preferably embodied in an analog-to-digital A/D circuit for improving the resolution of such A/D circuit.

In many systems where analog signals are converted to digital signals for further processing, it is desirable that such conversion occur with precision in order to preserve the information content of the signal and to minimize the introduction of noise. The analog-to-digital converters of such systems, that are mechanized, as successive approximation type, successive ranging type, or combinations thereof, also include a D/A converter that is utilized usually as feedback or reference apparatus to compensate for errors in the conversion from analog to digital. The resolution and accuracy of the final analog-to-digital conversion is dependent, of course, upon the resolution and accuracy of the digital-to-analog reference conversion incorporated therein. In this connection, the more bits that are used for the digital reference, the better the resolution. However, the greater the number of bits, the greater is the required accuracy of the D/A converter used as the reference.

For example, the conventional binary current-output D/A converter depends upon the accuracy of its trimmed resistor ladder, and also on the matching of the current switches driving the ladder. The matching of the ladder resistors and current switches becomes more critical as the resolution of the D/A converter increases. For example, a three-bit binary digital-to-analog converter which has eight different input states covering the binary range from "000" to "111", should provide eight different analog (current) output states. The difference between successive analog output levels should equal the least significant bit (LSB) weighting.

FIG. 1 is a diagram showing the relationship between an input digital code and the output level of a typical three-bit binary D/A converter. Although FIG. 1 illustrates the successive step sizes as ideally equal, a three-bit device typically requires the accuracy of each step to be within one-half step of such ideal. In other words, the accuracy need be $$(\pm \tfrac{1}{2} LSB)/8 \ LSB's = \pm \tfrac{1}{2}/2^n$$

where n=the number of bits. If the number of bits (n) is three, then the accuracy of the D/A converter is required to be one part out of 16. It follows then that in a four-bit D/A converter, the accuracy should be better than one part out of 32. As the number of bits increases such as up to twelve, for example, the required accuracy of the most significant bit (MSB) becomes one part of 8,192; and for thirteen bits, the accuracy required is at least one part out of 16,384. To gain insight as to the accuracy requirement and its meaning in terms of each bit, the D/A converter of FIG. 1 is broken down into weighted sections to show the relationship between each bit and the output. Curve 10 of FIG. 1 illustrates the on and off sequence of the least significant bit (LSB); while curve 11 represents the operation of the next most significant bit; and curve 12 illustrates the operation of the most significant bit (MSB). As is well known, the curves 10, 11 and 12 are all summed to provide the analog output, as represented by curve 14. Each step of the curve 14 corresponds to the increased analog value of the three bit digital input. It can be seen from Fig. 1 that the greatest transition occurs at the midpoint of the range or from digital word 011 to digital word 100 where all the bits change; that is, the most significant bit, represented by curve 12, changes from a zero to a one, bit two represented by curve 11 changes from a one to a zero, and the least significant bit, of course, changes from a one to a zero. At this midpoint, ($\tfrac{1}{2}$) the largest errors in the analog output are likely to occur. The two next greatest transition points are between words 001 and 010, and 101 and 110, respectively. These points, which represent the one-quarter and three-quarter points on the analog output range, are the points where the next greatest errors occur. These points correspond to the transition of bit two from zero to one and the transition of the least significant bit from one to zero. Although FIG. 1 illustrates a three-bit digital-to-analog converter, it is apparent that as the number of bits increases, the accuracy requirement of the MSB's becomes more stringent as previously mentioned. In an A/D converter that operates to convert both positive and negative signals, the accuracy error associated with the digital-to-analog reference conversion apparatus at half scale occurs at or near zero of the A/D converter. There are many applications, such as pulsed doppler radar systems, for example, where the input to the A/D converter is most likely at or near zero during operation which corresponds to the midpoint or half-scale of the D/A where inaccuracies are most likely to occur.

Thus, it is desirable that the analog output of digital-to-analog conversion apparatus be rendered more accurate regardless of its operating position over its range of values; and in one particular aspect, it is desirable that analog-to-digital conversion apparatus include an analog reference (i.e., D/A converter) that has minimal inaccuracies regardless of the relative position of the output over the entire range of the apparatus.

SUMMARY OF THE INVENTION

Broadly, and in accordance with the present invention, there is provided an improved method and apparatus for minimizing errors in the conversion of digital-to-analog signals by decreasing the effect of transition of the more significant bits of the converter apparatus. Such decreased effect is accomplished by coupling a plurality of digital-to-analog converters in a manner such that the ultimate analog output of the coupled plurality of converters is the composite result of the digital input.

In one aspect, the present invention provides for selectively operating one of a plurality of coupled digital-to-analog converters, with such selection for each conversion being a function of the digital input. More specifically, the D/A conversion apparatus is arranged to eliminate at least at mid-range the error arising at the transition between "0" and "1" of the most significant bit. In carrying out this function, a plurality of the digital-to-analog converters are connected in tandem with means controlled by at least the most significant bit of the digital input to render one of the plurality of D/A converters operative.

In another aspect, the present invention provides for connecting a plurality of D/A converters in parallel with each of the converters offset from one another such that a transition of the most significant bit of each converter occurs for a different step value of the analog output.

In accordance with another specific aspect of the invention, there is provided a sub-ranging analog-to-digital converter that includes a reference value from a plurality of digital-to-analog converters that are connected in parallel offset from one another such that the major word transitions of each converter occur at different steps in the analog output.

DESCRIPTION OF THE PREFERRED EMBODIMENTS

Figure 1:
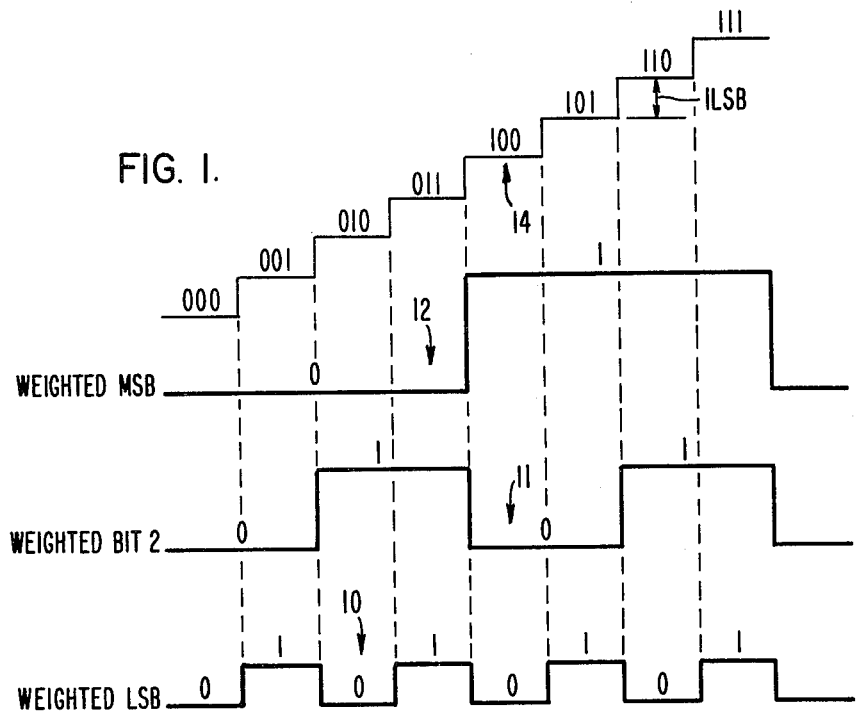
FIG. 1 is a graph illustrating the relationship of the individual bits to the output of a typical three-bit D/A converter to assist in the explanation of the background of the present invention.
Figure 2:
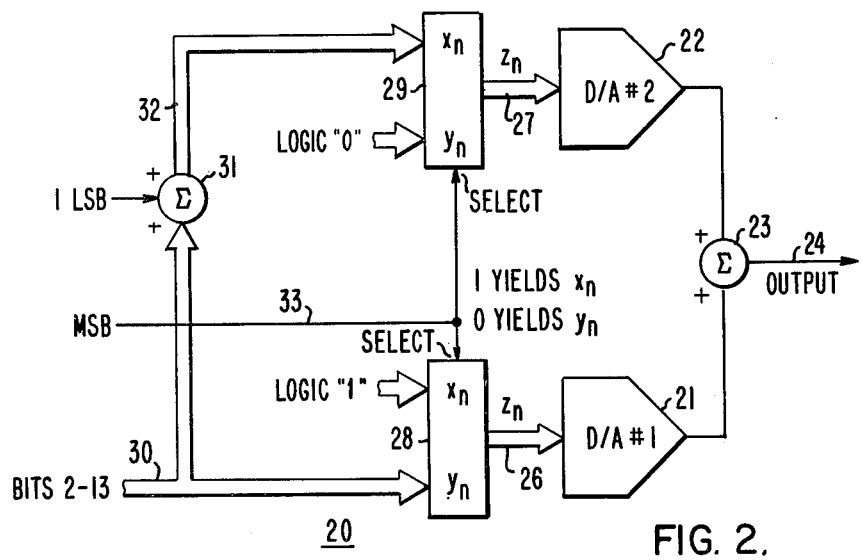
FIG. 2 is a block diagram illustrating an arrangement of D/A conversion apparatus according to one embodiment of the present invention.
Figure 3:
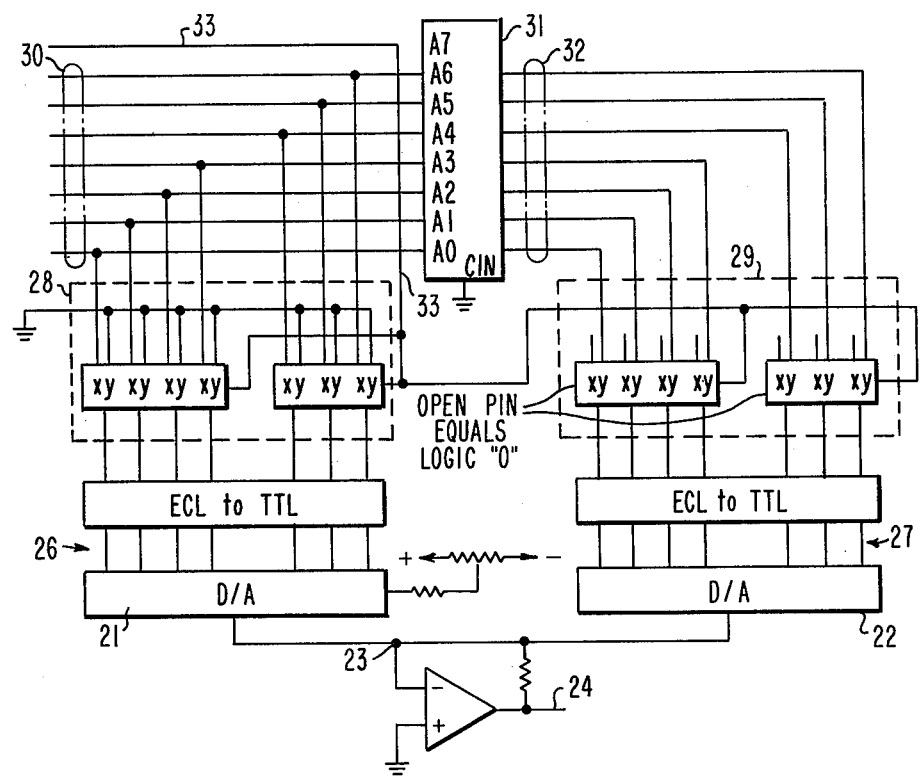
FIG. 3 is a block diagram illustrating in more detail the tandem arrangement of two seven-bit digital-to-analog converters in accordance with the embodiment of the invention illustrated in FIG. 2.
Figure 4:
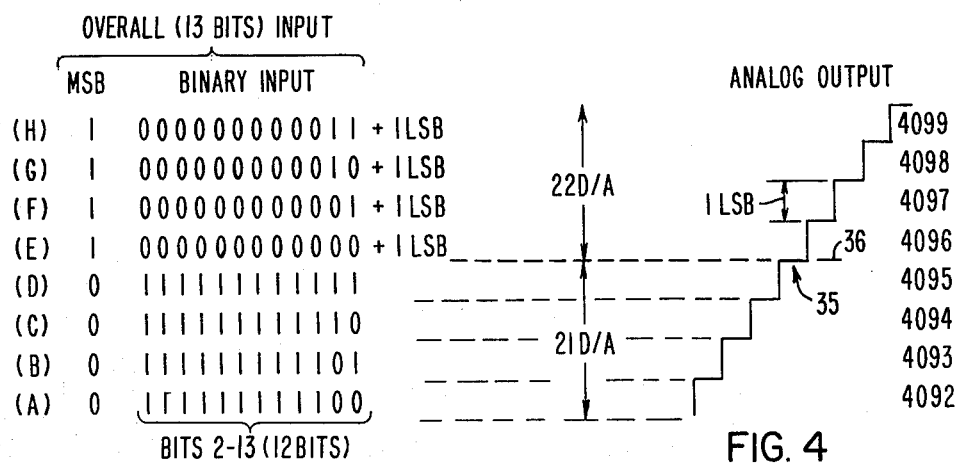
FIG. 4 is a graph illustrating the operation of the converter of FIG. 3.

Referring to FIG. 2, a system for converting digital-to-analog signals is generally referred to at 20, and comprises a pair of twelve-bit D/A converters 21 and 22, the analog outputs of which are applied to a summing device 23, and output over line 24. The digital input to the converters 21 and 22 occurs on lines 26 and 27 through multiplexers 28 and 29, respectively. The multiplexer 28 is biased to respond to a logic "1" input and the multiplexer 29 is biased to respond to a logic "0" input as shown in FIG. 2. The lesser twelve bits of a thirteen-bit digital word, for example, are input on 30 to the multiplexer 28, and through a summing device 31, and input 32 to the multiplexer 29. The most significant bit (MSB) of the thirteen-bit digital input is applied over line 33 to the select control of the multiplexers 28 and 29 such an MSB corresponding to a "0" causes the multiplexer 28 to respond to the lesser twelve-bits as an input; and an MSB corresponding to a binary "1" causes multiplexer 29 to respond to the lesser twelve bits as an input. One bit (LSB) is added to the digital words at 31 to offset the input to the multiplexer 29 by one increment. FIG. 3 illustrates a mechanization of the embodiment of FIG. 2 in more detail except it is shown for an 8 bit conversion apparatus, and those portions of FIG. 3 that are similar to the portions in FIG. 2 bear similar reference numerals. In the operation of FIGS. 2 or 3, and referring to FIG. 4, the stepped curve referred to generally as 35 represents the analog output of the apparatus that occurs on line 24. A typical thirteen-bit binary word (FIG. 2) is applied to input 30 and 33, respectively, with the MSB of such word being applied to 33; and depending upon whether the MSB is a logic "0" or a "1", determines which multiplexer 28 or 29 responds to such input. When the MSB is 1 the D/A 21 yields all 1's, when the MSB is 0, the D/A 21 yields data. For D/A 22, when the MSB is 0, it yields all 0's and when the MSB is 1, it yields data. Assuming a digital word corresponding to the binary word (A) of FIG. 4 is input, the MSB which is "0" is applied to line 33, and the remaining bits are applied to input 30. The word A (lesser twelve bits) are input directly to the D/A converter 21 through the multiplexer 28 which was selected by the MSB "0". Similarly, the binary input word (B) operates the D/A converter 21 to output the next higher increment which corresponds to the number 4093, for example. The apparatus 20 of FIG. 2 operates in the same manner for each incremental value up to and including the binary input (D) of FIG. 4 that corresponds to the step 4095, for example. At this point in the analog output, the D/A remains at this level referred to as 36 in FIG. 4; and at the next binary input (E), the MSB becomes a binary "1" and selects the multiplexer 29 to respond to the twelve-bit input word. The multiplexer 28 remains in its last operated condition such that the D/A 21 continues to apply an analog voltage at an amplitude corresponding to 36 to the input of the summing device 23. The applied digital word on line 30 is also incremented by one least significant bit at the summing device 31 thus applying an input digital word that corresponds to a one-bit increment or quanta from the bottom of the scale of the D/A 22. The value (E) of FIG. 4 is converted to an analog value by converter 22 and summed with the analog value at the level 36 from the D/A 21 so that the output on line 24 corresponds to a value 4096 in the example. Similarly, for each incremental value above the level 36 the D/A 22 is operated and its output is summed with the output of the D/A converter 21. It is noted, that at no time does the MSB applied to the input of either D/A converter change from "1" to "0" that would tend to create an error at half scale. Thus, in accordance with the method and system of the present invention the two similar D/A converters that are connected in a tandem fashion so that one operates above half scale while the other operates below half scale prevents a large transition of bits at half scale. The change of MSB's of each D/A converter occur only at the one-quarter and three-quarter scale, thus improving the accuracy of the ultimate analog-to-digital conversion. The tandem combination of similar twelve-bit D/A converters yields a thirteen-bit D/A conversion having excellent differential linearity at half scale. For precise overall linearity, that is linearity throughout the entire scale, it is preferable to utilize two D/A converters such that at least one has adjustable gain, since D/A converters are not identical. If precise overall linearity is not required, but excellent differential linearity, (the difference between adjacent steps) is required, which is the usual situation for A/D's that are used in pulsed doppler radar systems, for example, the tandem D/A approach described in connection with the embodiment of FIGS. 2 or 3 provides the desired result. In actual practice, the tandem D/A approach heretofore described was utilized in a two-range feedback A/D converter as an eight-bit D/A that is accurate to thirteen bits by using two fixed reference twelve-bit D/A converters, one of which was gain-adjusted.

Although the tandem D/A converter apparatus herein described was mechanized in a high speed successive ranging A/D converter as a high speed, high accuracy D/A converter offering particularly good differential linearity in the vicinity of half scale, the method and system of the present invention is applicable in any design with similar D/A performance requirements. Although the present method and system has been described in connection with the use of two D/A converters, it is feasible to use four such converters to increase the resolution by two bits; that is, a factor of four, and to eliminate differential linearity errors at half scale, quarter scale, and three-quarter scale. Therefore, the embodiment of FIGS. 2 and 3 provides for eliminating the half scale differential linearity error while doubling the resolution and accuracy.

By utilizing the two D/A converters with the input coding altered slightly as described to permit the two devices to operate in tandem, the differential linearity error at half scale is determined by the accuracy of only the LSB of one D/A converter rather than by the matching of the critical MSB weighting to the weighting of the remaining bits.

Figure 5:
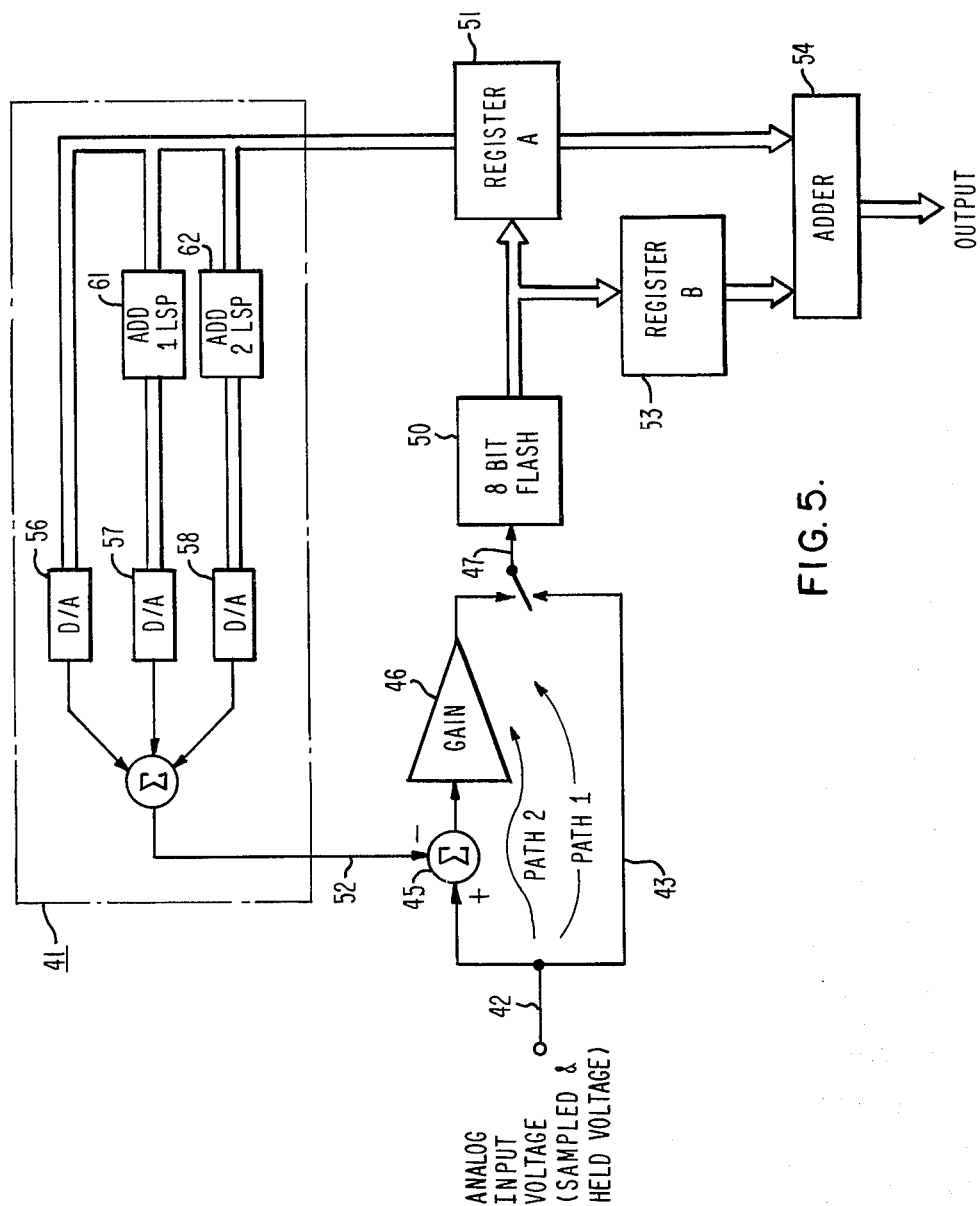
FIG. 5 is a schematic block diagram of a two-range feedback A/D converter that includes digital-to-analog conversion apparatus in accordance with another embodiment of the present invention.

Referring to FIG. 5, a schematic block diagram of a two-range feedback A/D converter is generally referred to as 40, and includes a D/A conversion apparatus within the dashed lines referred to at 41 according to another embodiment of the present invention. The A/D converter 40 has an input 42 where the analog voltage is applied to a path over line 43 and a path over line 44. The path over line 44 extends through a subtraction device 45 and an amplifier 46 to one terminal of a switch 47. The input voltage is also applied to the switch 47 over the path 43. With the switch 47 set to position "1", as shown in Fig. 5, the analog input voltage is applied to a conventional flash converter 50 which may be an eight-bit converter, for example. The flash converter 50 provides at its output a quantized version of the analog input 42. The eight-bit digital word from the converter 50 is applied to a register A referred to as 51, which in turn applies a digital word to the D/A conversion apparatus 41. The D/A output on line 52 is subtracted by device 45 from the analog input voltage on 44. The switch 47 is then set to position "2"; and the voltage applied to the input of the flash converter 50 is the amplified difference between the analog input voltage in path 44 and the analog feedback voltage on line 52. This difference voltage which is amplified and converted to a digital word by the flash converter 50 is applied to register B referred to at 53. The outputs of register 51 and register 53 are combined in an adder 54 to form the total output word. As is well known, the first conversion with the switch 47 at position "1", is a "coarse" quantization of the analog input voltage on line 42. The second conversion with the switch in position "2", which is on the amplified difference between the analog input voltage in the first conversion, provides a number of increments or quanta of analog values between the quanta of the coarse conversion. If the digital-to-analog conversion apparatus 41 does not accurately reproduce the voltage commanded by register A, referred to at 51, the second conversion added by B register 53 to the A register 51 will not exactly fill in the coarse steps. In fact, any errors in the D/A conversion show up directly in the total conversion output. As previously discussed, the greatest error occurs at half scale during the transition of the most significant bits in conventional digital-to-analog conversion apparatus. With only one D/A converter in the feedback of A/D apparatus of the type referred to at 40, such error would occur at half scale. In order to overcome the prior deficiencies, and in accordance with the present invention D/A conversion apparatus 41 is arranged to include a plurality of D/A converters referred to as 56, 57 and 58, respectively. These converters are connected in parallel to receive their input from the A register 51 and to apply their output to a summing device 59, which provides the summed output on the line 52 to the device 45 as previously described. The inputs to each of the D/A devices 56, 57 and 58 are offset from one another. This offset is accomplished by adding a least significant bit (LSB) to the digital word at the input of the converter 57 as noted by block 61; and to add to the digital word that is input to the converter 58, two LSB's as noted by block 62.

Figure 6:
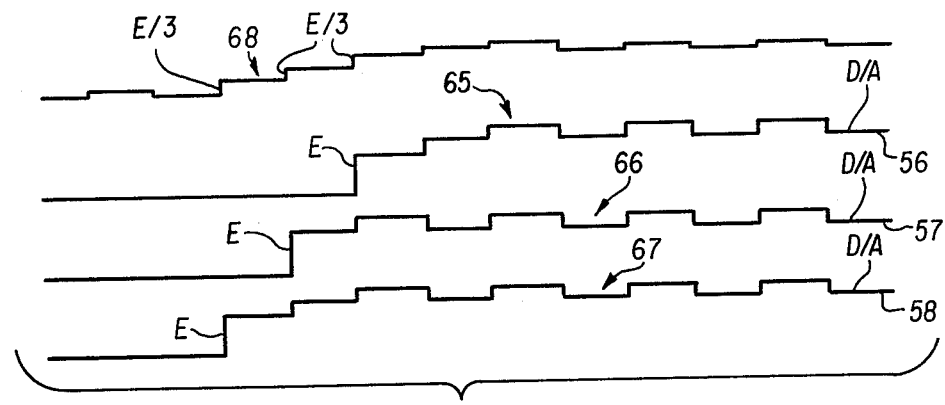
FIG. 6 is a graph illustrating how error characteristics of a D/A converter in a sub-ranging A/D converter are minimized with the benefit of the embodiment of the present invention illustrated in FIG. 5.

Referring to FIG. 6, curves 65, 66 and 67 represent the analog errors at the output in each of the D/A converters 56, 57 and 58, respectively. Each D/A is offset from the other D/A converters by one LSB out of eight bits. Thus, when the outputs of 56, 57 and 58 are combined, as represented by curve 68, the errors caused by the MSB or major bits of each converter do not occur in the same place; and where they do occur, the error contribution of each D/A converter is reduced to one-third the size of the individual errors all as shown by the curve 68. As previously mentioned, a large error may occur for each converter at the transition of the MSB, and the next larger error may occur at the second major bit transition, which error, of course, is not as likely to be as large as at the transition of the MSB.

Figure 7:
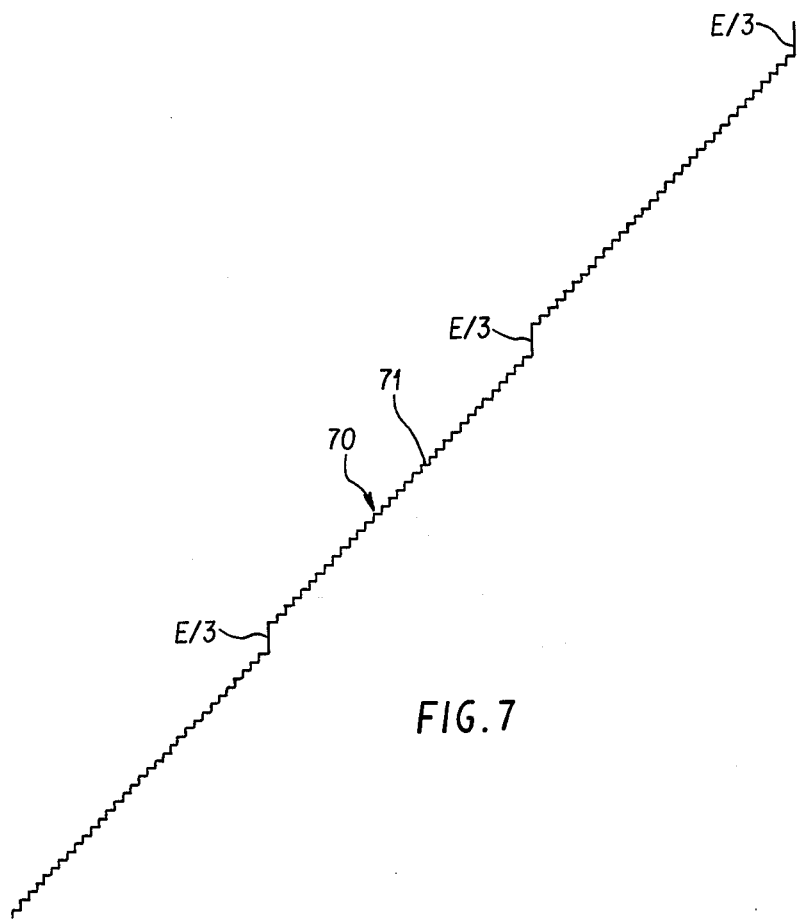
FIG. 7 is a graph illustrating the error characteristics of a sub-ranging converter with the benefit of that embodiment of the invention illustrated in FIG. 5.

Referring to FIG. 7, curve 70 illustrates the output of a sub-ranging type of analog-to-digital converter. As is well known to those skilled in the art, many quanta of the overall analog-to-digital characteristic lie between the word changes to the D/A. For example, in the case of a thirteen-bit A/D with two bits of overlap, there are 32 quanta, each of which is referred to at 71 between each offset of each D/A converter. In FIG. 7, it is assumed that three D/A's are connected in parallel; and each is assumed to be accurate to one-half of the twelfth bit. Thus, in the sub-ranging type A/D, with a parallel offset connection of similar D/A converters, an error one-third the size of the conventional connection error appears three times on the characteristic referred to at 70 with each error being separated by 32 quanta of information. It is understood the second most significant errors caused by the D/A are similarly reduced by a factor of 3. Again, the second most significant errors are one-third the size and occur three more times than they would with a conventional connection. Likewise, such groups of three are similarly separated by 32 quanta and are displaced by approximately 2,048 quanta from the most significant group of three errors. It follows, that the third MSB groups are reduced by a factor of approximately 3 and so on.

In systems such as radars, for example, having a high dynamic range, a return signal may range in size from the smallest possible, such as would be caused by front end noise, to a maximum as caused by a large clutter return. In order to be able to handle a large return, the receiver gain control sets the minimum signal at the A/D input to a small value, such as one quanta or possibly less. Therefore, under minimum signal return conditions, the return exercises only a tiny section of the A/D converter characteristic. Therefore, small imperfections in an A/D characteristic can have a devastating effect on the receiver noise figure or minimum signal discernibility. Decreasing the magnitude of the A/D characteristic error by one-third therefore is extremely significant.

A perfect A/D converter will tend to increase the noise level of a 1-quanta RMS input signal to 1.04 quanta at the D/A output. A 1-quanta A/D error will increase the noise output to 1.48 quanta. Thus, the noise figure of the radar is increased by 3 dB if the input noise resides at the place on the A/D characteristic where the error exists. Reducing the error by a factor of 3, therefore, is very significant.

Thus, the embodiment of the present invention that includes the parallel offset D/A connection is particularly well suited to sub-ranging A/D's since, even though the D/A must be accurate to the same accuracy as the A/D, only the most significant bits are exercised. In the example given in FIG. 7, the eight most significant bits are used, but the lower four bits are not used. This mechanization, along with the digital correction schemes used in sub-ranging A/D's, is used to allow an A/D to convert properly over its full range and resolution. The parallel-offset D/A connection could also be used in successive approximation A/D converters with a resulting loss of accuracy at the very ends of the A/D characteristic. Such loss of accuracy occurs because all of the bits of the D/A in a successive approximation A/D are used. Obviously, when D/A's are offset in the fashion described herein, the composite D/A characteristic becomes non-linear over the last M least significant bits where M is the number of least significant bits of offset between the D/A's. The parallel/offset D/A embodiment may be used in any application where D/A differential linearity error is of essential importance and a small section of non-linear performance at each end of the D/A characteristic is of no significance.

In summary, we have provided an improved method and system of increasing the accuracy of a digital-to-analog converter, as well as an analog-to-digital converter using a digital-to-analog reference. This has been accomplished by minimizing the effect of the error at the transition of the major significant bits in the D/A conversion. Although the invention has been described in connection with the conversion of a particular number of bits, it is understood that the method and system herein applies equally well to converters utilizing a total number of bits other than those set forth herein. Although a specific number of D/A converters have been described, it is understood that in the first described embodiment more than two D/A converters could be utilized; and in the second described embodiment more or fewer D/A converters may be used without departing from the spirit or scope of the present invention.

What we claim is:

1. Apparatus for converting binary coded digital input signals having most significant and least significant bits into corresponding analog signals, comprising:
   at least a pair of digital to analog converters, each said converter being effective when activated to receive at its respective input a digital signal and generate at its output a corresponding analog signal;
   means combining the output of each converter to provide a common analog output;
   means to apply the digital input signal to at least both said converters, including means modifying the digital input signal to one of said converters to generate an offset of at least one significant bit from the input to another of said converters; and
   means to apply the digital input signal selectively to one of said converters in accordance with the binary state of a more significant bit of the input signal to obtain the analog signal of the common analog output from the selected converter whereby switching errors are reduced at times when the more significant bits change their respective binary state.

2. Apparatus for converting binary coded digital input signals having most significant and least significant bits into corresponding analog signals, comprising:
   at least a pair of digital to analog converters, each said converter being effective when activated to receive at its respective input a digital signal and generate at its output to corresponding analog signal;
   means combining the output of each converter to provide a common analog output;
   means to apply the digital input signal to at least both said converters, including means modifying the digital input signal to one of said converters to generate an offset of at least one significant bit from the input to another of said converters; and
   a multiplexer connected to the input of each of the converters;
   means for applying the lesser significant bits of the input signal to each of the multiplexers; and means to apply the digital input signal to one of said multiplexers in accordance with the binary state of one of the more significant bits.

3. Apparatus according to claim 1 wherein the means modifying the digital input signal to one of said converters, comprises:
   means for incrementing the significant bit of the digital input signal to one of the converters by at least one least significant bit.

* * * * *